(12) United States Patent
Munroe et al.

(10) Patent No.: US 7,733,922 B1
(45) Date of Patent: Jun. 8, 2010

(54) METHOD AND APPARATUS FOR FAST PULSE HARMONIC FIBER LASER

(75) Inventors: Michael J. Munroe, Eugene, OR (US);
Theodore Alekel, Portland, OR (US);
David A. Dutton, Corvallis, OR (US);
David H. Foster, Corvallis, OR (US);
Joseph G. LaChapelle, Philomath, OR (US)

(73) Assignee: Deep Photonics Corporation, Corvallis, OR (US)

( * ) Notice: Subject to any disclaimer, the term of this patent is extended or adjusted under 35 U.S.C. 154(b) by 61 days.

(21) Appl. No.: 12/239,676

(22) Filed: Sep. 26, 2008

Related U.S. Application Data (60) Provisional application No. 60/976,202, filed on Sep. 28, 2007.

(51) Int. Cl.
*H01S 3/30* (2006.01)
(52) U.S. Cl. .............................. 372/6; 372/21; 372/22; 372/69; 372/102
(58) Field of Classification Search .................... 372/6, 372/21, 22, 69
See application file for complete search history.

(56) References Cited

U.S. PATENT DOCUMENTS

| | | | |
|---|---|---|---|
| 5,499,134 A | 3/1996 | Galvanauskas et al. | |
| 5,696,782 A | 12/1997 | Harter et al. | |
| 5,974,059 A * | 10/1999 | Dawson | 372/6 |
| 6,014,249 A | 1/2000 | Fermann et al. | |
| 6,275,512 B1 | 8/2001 | Fermann | |
| 6,347,007 B1 | 2/2002 | Grubb et al. | |
| 6,671,293 B2 | 12/2003 | Kopp et al. | |
| 2004/0246570 A1 * | 12/2004 | Feillens et al. | 359/341.1 |
| 2008/0086118 A1 * | 4/2008 | Lai et al. | 606/11 |

OTHER PUBLICATIONS

Jeong et al., "Single-mode plane-polarized ytterbium-doped large-core fiber laser with 633-W continuous-wave output power," Optics Letters, May 2005, 30(9): 955-957.
Kovalev et al., "Suppression of stimulated Brillouin scattering in high-power single-frequency fiber amplifiers," Optics Letters, 2006, 31(2): 161-163.

* cited by examiner

*Primary Examiner*—Dung T Nguyen
(74) *Attorney, Agent, or Firm*—Townsend and Townsend and Crew LLP (57) ABSTRACT

A fiber laser system includes a predominately single spatial mode, linearly polarized master oscillator providing a set of optical pulses and a polarization-maintaining optical isolator optically coupled to the master oscillator. The fiber laser system also includes a fiber amplifier optically coupled to the optical isolator and including a power amplifier comprising a double clad gain fiber, one or more pump lasers, and a pump coupler. The fiber laser system further includes a pulse compression stage optically coupled to the fiber amplifier. The pulse compression stage includes a volume holographic phase grating. Moreover, the fiber laser system includes a nonlinear frequency conversion stage optically coupled to the pulse compression stage.

22 Claims, 4 Drawing Sheets

METHOD AND APPARATUS FOR FAST PULSE HARMONIC FIBER LASER

CROSS-REFERENCES TO RELATED APPLICATIONS

The present application claims benefit under 35 U.S.C. §119(e) of U.S. Provisional Patent Application No. 60/976,202, filed on Sep. 28, 2007, entitled "Fast Pulse Harmonic Fiber Laser" the disclosure of which is hereby incorporated by reference in its entirety for all purposes.

BACKGROUND OF THE INVENTION

This invention relates generally to high performance pulsed laser frequency conversion systems that operate with high power, visible and near-infrared spectral output, narrow spectral linewidths, and freedom to adjust pulse parameters and characteristics.

Figure 1:
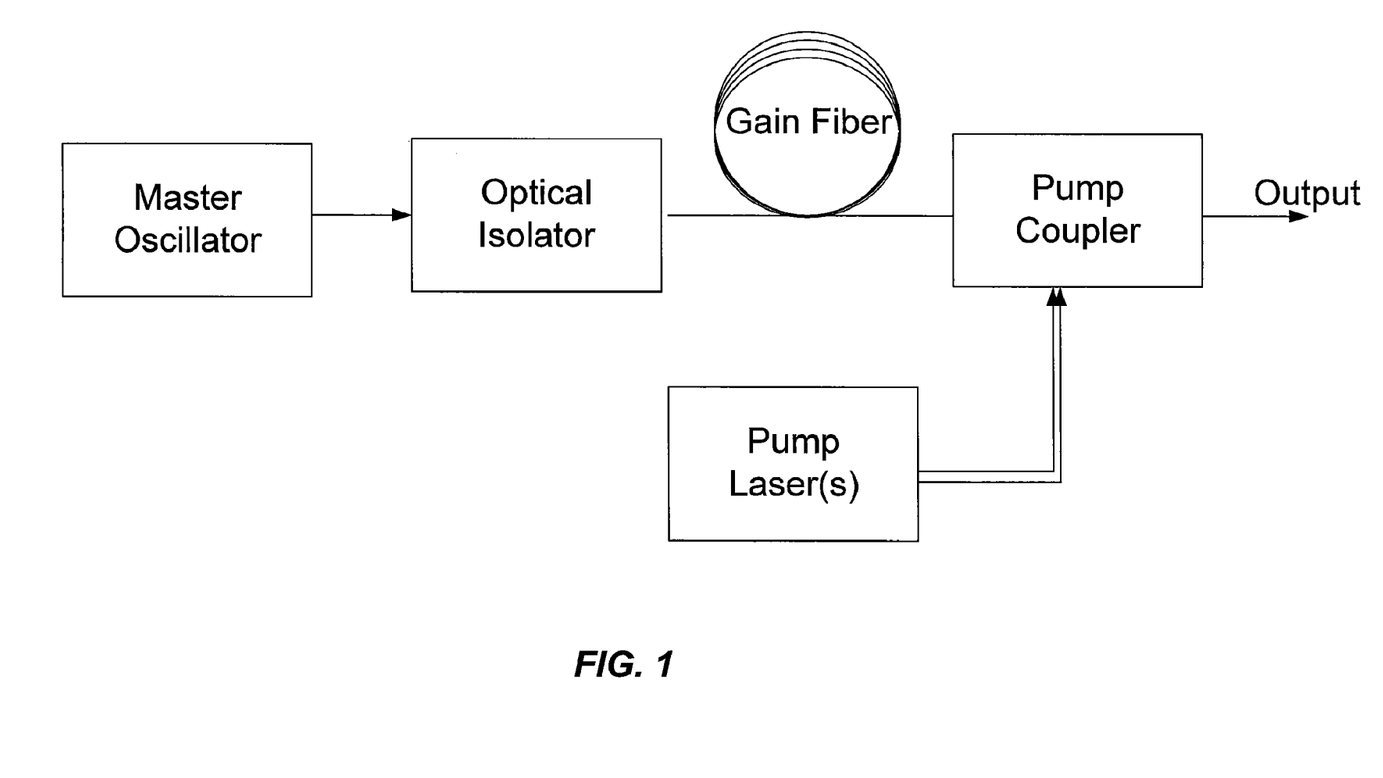
FIG. 1 is a schematic of a conventional fiber laser.

Fiber lasers have advanced to become economical and efficient high power infrared laser sources. Average optical output powers of tens of kilowatts are currently available in commercial fiber laser systems. FIG. 1 is a schematic of a typical fiber laser system known in the art with a master oscillator fiber amplifier (MOFA) architecture. The master oscillator (also known as the seed laser) emits a low power optical signal that is coupled into the amplifier section through an optical isolator. The optical isolator protects the master oscillator from any light counter-propagating back through the amplifier section. The amplifier section consists of a length of gain fiber that is pumped by one or more pump lasers (typically diode lasers) through a pump coupler. The gain fiber may be multi or single spatial mode, polarization random or maintaining, cladding pumped or core pumped, and may have a variety of dopants (for example Yb, Er, Nd, Pr, etc.) depending on the emission and pumping wavelengths. The pump laser light is absorbed by the dopants in the gain fiber, raising the dopants into an excited state. The emission from the master oscillator is amplified through stimulated emission as it interacts with the excited dopants implanted in the fiber core.

Many variants of the above design are used, including but not limited to multiple gain stages with multiple pumps, the inclusion of various filtering elements, a delivery fiber at the output of the laser, and use of forward and/or backward propagating pumps. Fiber lasers can operate with a wide range of output parameters to satisfy the varying constraints of an application. It is the specifications of the individual fiber amplifier subsystems that determine the output emission. The output emission of a fiber laser can be specified with the average output optical power, peak output optical power, temporal pulse width, center optical wavelength, polarization, spatial mode, and spectral bandwidth. Pumping limitations, gain limitations, optical damage to components, and nonlinear impairments require a unique system design of the elemental blocks of a fiber laser to achieve the desired set of output parameters.

It is desirable to use fiber laser systems to replace current solid state and gas laser systems used in illumination, inspection, and micromachining in the visible and ultraviolet (UV) wavelengths. However, fiber lasers operate in the near infrared (NIR) wavelength region and require nonlinear frequency conversion (FC) to convert the NIR output emission into usable visible and UV wavelengths. Since the efficiency of the nonlinear frequency conversion is typically very low (<1%) at optical powers less than 100 Watts, it is advantageous to use a pulsed laser system with high peak power as the fundamental source. However, many illumination and inspection systems are designed to use continuous wave (CW) laser sources. In order to use a pulsed source in these applications the pulse repetition rate needs to be much higher than the response rate of the system. The term quasi-continuous wave (QCW) is used within this application to describe a pulsed light source of sufficiently high repetition rate so as to appear CW to the application. The repetition rate typically must be greater than 10 MHz to appear QCW in illumination and inspection applications. Thus, in order to gain a significant benefit in peak power, pulse widths much less than 1 ns are required. A common class of lasers that produce a steady stream of sub-nanosecond pulses is mode-locked lasers.

Nonlinear frequency conversion generally requires high peak power, narrow optical bandwidth, linear polarization, and single spatial mode. However, it has not yet been practical to simultaneously satisfy these requirements in a sub-nanosecond, pulsed fiber laser with repetition rate greater than 10 MHz due to nonlinear impairments. In particular Stimulated Brillouin Scattering (SBS), Stimulated Raman Scattering (SRS), and Self Phase Modulation (SPM) limit the performance of fiber lasers operating in this regime. These nonlinear impairments increase with higher peak intensity in the fiber, with narrower spectral bandwidth, shorter pulse width (especially SPM), and by propagating linear polarized light in a single spatial mode. Examples of mode-locked fiber lasers are known in the art that reduce nonlinear impairments because of the large natural bandwidth of the femtosecond pulses they create, as well as nanosecond pulsed fiber lasers that use a master oscillator with artificially high optical bandwidth to reduce nonlinearities. Similarly, fiber lasers with kilowatt average power are known in the art. These lasers function in continuous wave operation, and do not provide the beam quality, peak power, and polarization properties useful for efficient frequency conversion. Thus, there is a need in the art for improved methods and systems for high performance pulsed laser frequency conversion.

SUMMARY OF THE INVENTION

The fiber laser apparatus invention described herein is capable of concurrently generating linearly-polarized laser radiation with peak powers from 5 kW to 1 MW, wavelengths of 508-542 nm or 750-788 nm, pulses with temporal pulse widths of 1-100 ps, pulse train repetition rates of 10 MHz to 1 GHz, average powers of 5-200 W, narrow spectral bandwidth less than 0.3 nm, and a predominately single spatial mode. Embodiments of the present invention provide a novel laser system that is very agile in the control of its repetition rate and output peak power. This laser may be tailored to many different applications by making small changes in the emission characteristics of the master oscillator and pulse compression stages.

According to an embodiment of the present invention, an apparatus for producing coherent pulsed light from a fiber-based master oscillator/fiber amplifier architecture is provided. The apparatus includes a predominately single spatial mode, linearly polarized master oscillator providing a set of optical pulses and a polarization-maintaining optical isolator optically coupled to the master oscillator. The apparatus also includes a fiber amplifier optically coupled to the optical isolator and including a power amplifier comprising a double clad gain fiber, one or more pump lasers, and a pump coupler. The apparatus further includes a pulse compression stage optically coupled to the fiber amplifier.

The pulse compression stage is unique in that it efficiently compresses (by more than a factor of five) pulses of narrow linewidth and high average power. Pulse compression means known in the art cannot simultaneously provide efficient pulse compression for high average power light with narrow spectral linewidth. The primary limitation is grating technology. Surface reflection gratings require elaborate cooling techniques for powers over several Watts. Fiber Bragg gratings have not been used at high average power because of difficulty in coupling in and out of the fiber grating. While the requirement for high efficiency can be accomplished by ruled surface transmission gratings, ruled surface gratings cannot be manufactured with the line density required in order to compress pulses with narrow spectral linewidth. The solution to these limitations in the prior art used in this invention is the use of volume phase holographic (VPH) gratings in transmission mode. The VPH gratings can handle high average powers due to their low absorption at near infrared (NIR) and visible wavelengths, and due to the holographic processing in their manufacture high line densities our possible. The high efficiency of VPH gratings is accomplished by a chemical tuning of the intermediate material used in the grating. The pulse compression stage includes a volume holographic phase transmission grating of line density greater than 1750 lines/mm and efficiency greater than or equal to 90%. Moreover, the apparatus includes a nonlinear frequency conversion stage optically coupled to the pulse compression stage.

According to another embodiment, a fiber laser system capable of concurrently generating linearly-polarized laser radiation with peak powers from 5 kW to 1 MW, wavelengths of 508-542 nm, pulses with RMS durations of 1-100 ps, pulse train repetition rates of 10 MHz to 1 GHz, average powers of 5-200 W, narrow spectral RMS bandwidth less than 0.3 nm, and a predominately single spatial mode is provided. An output of the apparatus is optically coupled from the power amplifier to the pulse compression stage via a large mode area polarization-maintaining delivery fiber of length less than 5 m. The fiber laser system includes a master oscillator that generates linear polarized infrared laser radiation with wavelengths of 1015-1085 nm, linear chirped pulses with RMS durations of 10 ps to 1 ns, pulse train repetition rates of 10 MHz to 1 GHz, narrow spectral RMS bandwidth less than 0.5 nm, and a predominately single spatial mode. The fiber laser system also includes a polarization-maintaining optical isolation means that attenuates the backward propagating light from the fiber amplifier while transmitting the forward propagating light from the master oscillator. The fiber laser system further includes a fiber amplifier containing a power amplifier that amplifies the master oscillator emission transmitted through the isolator. The fiber amplifier includes a polarization-maintaining, large-mode-area, double-clad Yb-doped gain fiber, one or more diode pump lasers emitting light of wavelength 976±6 nm, and a means of coupling the emission from the diode pump lasers into the cladding of the gain fiber. The fiber laser system additionally includes one or more pulse compression stages and a nonlinear frequency conversion stage.

In particular embodiments, the fiber laser system can also include one or more preamplifier stages preceding the power amplifier. Each preamplifier stage includes a polarization-maintaining doped gain fiber, one or more pumps energizing the gain fiber, means of coupling the pump power into the cladding or core of the gain fiber, and an optical isolator between the preamplifier and the subsequent preamplifier or power amplifier. The pumping means in the power amplifier may be one or more optical fiber-coupled laser diode bar arrays or one or more optical fiber-coupled single emitter laser diodes. The master oscillator may be a frequency-controlled, passively mode-locked diode laser pumped by an electric current, a frequency controlled CW diode laser coupled to an external electro-optic modulator, or a diode-pumped solid-state laser.

In other particular embodiments, a large mode area polarization delivery fiber of length less than 5 m guides the emission from the power amplifier to the pulse compressor. Additionally, a temperature controller can be used to control the temperature of the pump amplifier gain fiber with a predetermined temperature gradient along the length of the gain fiber. Embodiments of the present invention can be used in a variety of systems including: a light detection and ranging (LIDAR) system, a laser-based micromachining system, a laser-based defect inspection system, a laser-based treatment or analysis system for use with biological tissues or processes, a laser-based remote sensing system, or a laser-based communications system.

In a particular embodiment, the apparatus is a fiber laser system that includes a system for adjusting the temporal pulse width and repetition rate of the master oscillator emission. This system is used to vary the fiber laser emission peak power and average power.

Numerous benefits are achieved using the present invention over conventional techniques. For example, an embodiment according to the present invention provides a laser apparatus that can produce picosecond scale pulses with narrow enough optical bandwidth for effective frequency conversion at high average powers and with a rugged fiber-based construction. The picosecond harmonic pulses may be frequency converted to UV wavelengths for micromachining or inspection applications, or used directly for micromachining applications. Nonlinear frequency conversion of the output light can be accomplished with high efficiency due to the narrow spectral bandwidth of the light. Depending upon the embodiment, one or more of these benefits may exist. These and other benefits have been described throughout the present specification and more particularly below.

DETAILED DESCRIPTION OF SPECIFIC EMBODIMENTS

Without limiting embodiments of the present invention, the following glossary is provided in relation to the description herein.

Chirped pulse: represents a temporal pulse of electromagnetic radiation in which the wavelength changes during the duration of the pulse.

Deep ultraviolet (DUV): A portion of the electromagnetic spectrum with wavelengths in the range of 100-315 nm.

Diode Laser: refers to a light-emitting diode designed to use stimulated emission to generate a coherent light output. Diode lasers are also known as laser diodes or semiconductor lasers.

Diode-Pumped Laser: refers to a laser having a gain medium that is pumped by a diode laser.

Double-clad Fiber: An optical fiber that contains a core region that guides a first light signal, surrounded by a first cladding region that contains the first light signal within the core. The first cladding region also guides a second light signal. The first cladding region is surrounded by a second cladding region that contains the second light signal in the first cladding region.

Fiber Laser: A laser may be constructed using an optical fiber as the gain medium and be pumped with optical energy. Fibers are typically glass-type materials, though may be crystalline or glass-nano-crystal composites.

Harmonic Generation: With relation to radiant energy, the conversion of electromagnetic radiation having a given frequency into radiation having a multiple of the frequency. This can occur when an intense directional light beam passes through a nonlinear optical medium.

Infrared Radiation: refers to electromagnetic radiation characterized by a wavelength between about 700 nm and about 5000 nm.

Large Mode Area Fiber: A fiber with a mode area larger than that of typical single mode step index fiber. The fibers typically support the propagation of a single to few spatial modes. Several examples of large mode area fibers are photonic crystal fiber, low index step fiber, and gradient index fiber. The larger mode area of these fibers reduces the effects of fiber nonlinearities. Typically the mode areas are greater than 200 $\mu m^2$.

Laser: refers to an acronym for light amplification by stimulated emission of radiation. A laser is a cavity that contains any material—crystal, glass, liquid, dye or gas—where an atom of which are capable of being excited to a metastable electronic state by a pumping energy e.g., by light or an electric discharge. The light emitted by the atom's electron as it returns to its energetic ground state is able to promote stimulated emission of other atoms in the medium. The light (referred to herein as stimulated radiation) is continually increased in intensity as it makes multiple round trips through the cavity.

Light: refers to electromagnetic radiation in a range of frequencies running from infrared through the ultraviolet, nominally corresponding to a range of wavelengths from about 100 nm to about 15 $\mu m$.

Mode: The electromagnetic spatial pattern that forms in an optical cavity when the cavity is optically excited at a frequency that is sufficiently near one of the resonant frequencies of the cavity.

Mode-Locked Laser: refers to a laser that functions by controlling the relative phase (sometimes through modulation with respect to time) of each mode internally to give rise selectively to energy bursts of high peak power and short duration, e.g., in the picosecond domain.

Nonlinear Optic: refers to a class of optical phenomena that can typically be viewed only with nearly monochromatic, directional beams of light, such as those produced by a laser. Harmonic generation (e.g., second-, third-, and fourth-harmonic generation), optical parametric oscillation, sum-frequency generation, difference-frequency generation, optical parametric amplification, and the stimulated Raman effect are examples.

Nonlinear material: refers to materials that possess a non-zero nonlinear dielectric response to optical radiation that can give rise to nonlinear effects. Examples of nonlinear materials include crystals of lithium niobate ($LiNbO_3$), lithium triborate ($LiB_3O_5$ or LBO), beta-barium borate ($\beta$-$BaB_2O_4$ or BBO), cesium lithium borate ($CsLiB_6O_{10}$ or CLBO), yttrium aluminum borate ($YAl_3B_4O_{12}$) and its isomorphs, as well as quasi-phase-matched materials.

Phase-matching: refers to the technique used in a multi-wave nonlinear optical process to enhance the distance over which the coherent transfer of energy between the waves is possible. For example, a three-wave process is said to be phase-matched when $k_1+k_2=k_3$, where $k_i$ is the wave vector of the $i^{th}$ wave participating in the process. In frequency doubling, e.g., the process is most efficient when the fundamental and the second harmonic phase velocities are matched.

Pulse width: Also known as pulse length, refers to the time or duration of the pulse emitted by a pulsed laser, in seconds.

Q-switch: refers to a device used to rapidly change the Q (quality) of an optical resonator.

Q-switched Laser: refers to a laser that uses a Q-switch in the laser cavity to prevent lasing action until a high level of inversion (optical gain and energy storage) is achieved in the lasing medium. When the switch rapidly increases the Q of the cavity, e.g., with an acousto-optic or electro-optic modulators or saturable absorbers, a giant pulse is generated.

Quasi-Continuous Wave (QCW): A laser that generates a succession of pulses at a high enough repetition rate to appear continuous to the application.

Repetition rate: The frequency of a running sequence of laser pulses, typically given in Hertz.

UV-grade huntite: An aluminum double borate material with crystallinity isostructural to the mineral huntite, having a composition given by $RAl_3B_4O_{12}$ where R is comprised of one or a plurality of the elements {Sc, La, Y, Lu}, and the material optically transmits deep ultraviolet (DUV) radiation greater than 75% over the spectral range 190-350 nm.

Waist: 1) The narrowest point of a nominally Gaussian beam; 2) The Gaussian beam radius at the narrowest point. The Gaussian beam radius is the radius at which the intensity of a nominally Gaussian beam is $1/e^2$ of the central, peak intensity.

According to an embodiment of the present invention, a fiber-based laser system is provided that includes a nonlinear second harmonic frequency conversion stage combined with a pulsed NIR fiber laser and one or more pulse compression stages that uniquely emits coherent radiation with a combination of all the following properties: stable linear polarization, high peak power, pulse durations from 1 ps to 100 ps, narrow spectral bandwidth, and predominately one spatial mode. Embodiments of the present invention are applicable in the gain window of ytterbium-(Yb) doped fiber (1015-1085 nm, such as 1064 nm) emitting light with a nominal wavelength of 532 nm or the gain window of erbium-(Er) doped fiber (1500-1575 nm, such as 1545 nm) emitting light with a nominal wavelength of 774 nm. An object of this invention is to produce stable linearly polarized light pulses with a peak powers in the range of 5 kW to 1 MW, wavelength ranges of 508-542 nm or 750-788 nm (Yb- and Er-doped fiber, respectively), temporal pulse widths that range from 1-100 ps, repetition rates that range from 10 MHz to 1 GHz, average powers that range 5-200 W, narrow spectral bandwidths$\leq$0.3 nm, and predominately a single spatial mode and to convert this emission using nonlinear frequency conversion.

As described herein, a predominately single mode is a spatial distribution of light that can be focused down to a near diffraction limited spot with an $M^2<1.5$.

In some embodiments of the present invention temporal pulse widths and spectral bandwidths are used as a measure of temporal or spectral characteristics of the pulse based on energy in a predetermined portion of the pulse. For these characteristics, the majority of the pulse energy is contained in a predetermined portion of the pulse, for example, a majority of the energy is contained within the bandwidth of the pulse. This is in contrast to FHWM measures, in which a pulse can be characterized by a FWHM pulse width that includes only a small portion of the power in the pulse. An example would be a pulse with broad shoulders and a small temporal duration peak above the shoulders. If the amplitude of the peak is more than twice the amplitude of the shoulders, then the FWHM will be associated with the width of the peak, although only a small fraction of the total power is contained in the peak. Similar measures can be found in frequency space. The measurement used in embodiments herein more accurately measures the power characteristics of the pulse as a function of time Thus, embodiments of the present invention utilize temporal and spectral characteristics that are largely independent of long tails on a distribution, which can be a problem with FWHM measurements in which a majority of the power is present in the tails of the distribution. In a specific embodiment, the temporal pulse width is defined as the width that includes half the power in the pulse and the spectral bandwidth is defined as the bandwidth that includes half the power in the pulse.

The subsystems that make up the fiber laser are specified to maximize the peak power output while minimizing the nonlinear impairments and to keep the spectral bandwidth less than 0.5 nm. While fundamental equations have been established in the art for passive fiber use in laser systems, the inventors have developed new models to optimize laser performance and select components useful to achieve the following characteristics concurrently: high peak power, narrow spectral bandwidth, predominately one spatial mode, stable linear polarization, and pulse widths from 1-100 ps.

The fiber laser in an embodiment is constructed by using a master oscillator and a fiber amplifier architecture. The master oscillator is the laser source that emits the seed radiation that is amplified by the fiber amplifier. The emission output is a series of laser energy pulses with a peak-to-valley contrast power ratio of greater than 40 dB in order to assure that >90% of the energy in the emission is contained within the pulses. The fiber laser emission wavelength, temporal pulse shape, and repetition frequency are determined by the master oscillator. The master oscillator emits radiation in predominantly a single spatial mode with a stable linear polarization. In a particular embodiment, the spectral bandwidth of the master oscillator emission is less than 0.5 nm, but greater than 10 pm in order to minimize SBS in the amplifier subsystem. The transform limited spectral width will generally be greater than 10 pm for the short temporal pulse widths provided by embodiments of this invention. The repetition rate of the pulse train is preferably between 10 MHz and 1 GHz. The master oscillator emits linearly chirped pulses. These are pulses for which the wavelength changes with time by a linear relationship. These pulses will be compressed (all of the wavelengths are concurrently compressed in time) in the system after the fiber amplifier, resulting in pulses with shorter temporal duration and higher peak power. Amplifying chirped pulses reduces the effects of nonlinearities in the fiber amplifier, particularly SPM. The temporal pulse width of the master oscillator emission is approximately between 10 ps and 1 ns.

While a preferred embodiment herein describes a 1064 nm wavelength, frequency-stabilized mode-locked diode laser as the master oscillator, other lasers systems may be used including, including, but not limited to mode-locked diode pumped solid state laser oscillators, mode-locked fiber laser oscillators, diode lasers operating at other wavelengths within the Yb or Er gain spectra, as well as a CW source combined with an external modulator. The master oscillator may include a low power fiber amplifier to increase the power of the master oscillator emission.

The emission from the master oscillator then propagates, either via free-space optics or optical fiber, through an apparatus for optical isolation in order to protect the master oscillator from backward-propagating emission from the fiber amplifier.

After passing through a means of optical isolation, the master oscillator emission is amplified by the fiber amplifier subsystem. The fiber amplifier subsystem consists of one or more fiber amplifier gain stages pumped by one or more diode lasers for each stage. A fiber gain stage consists of a length of Yb- or Er-doped fiber, one or more pump laser diodes (typically based on AlGaAs/GaAs designs), and a means of coupling the emission of the pump laser diodes into the doped gain fiber as well as coupling the master oscillator emission into the core of the gain fiber. The amplifier stages may be considered either a preamplifier or power amplifier stage. A preamplifier stage provides high gain, relatively low output power, while the power amplifier operates with lower gain, but delivers high output power, and generally operates in a saturated gain regime. The preamplifier precedes the power amplifier in a fiber amplifier system. The power amplifier is back-pumped preferably, e.g. the pump laser diode emission propagates towards the master oscillator. Forward pumping alone increases the fiber nonlinear impairments and is not desirable in the power amplifier stage. In the case of more than one gain stage, each gain stage is separated from the preceding gain stage by a means of optical isolation in order to protect the previous gain stage from damage and prevent the buildup of backward propagating amplified spontaneous emission. The gain fiber is polarization-maintaining and may be single-clad or double-clad fiber. The power amplifier stage of the fiber amplifier system is specified to use double-clad, large mode area (LMA) gain fiber in order to decrease SBS, SRS, and SPM. In the case of an Yb-doped power amplifier gain stage, the fiber length is kept to a minimum (<5 m) and optically pumped by laser diodes with output radiation that is wavelength-controlled to 976 nm. Similarly, an Er-doped power amplifier gain stage will use a fiber length that is kept to a minimum and optically pumped by laser diodes of about 980 nm in wavelength.

The LMA power amplifier gain fiber may not be a strictly single spatial mode fiber; several higher order optical modes may be guided by the fiber. One method to suppress the amplification of higher order spatial modes in the power amplifier is to wrap the power amplifier gain fiber around a spool of a selected radius. The higher order spatial modes have a much greater bending loss than the desired lowest order optical spatial mode in the LMA fiber. This spool may be temperature controlled in order to dissipate heat generated in the gain fiber or to cause a temperature gradient in order to reduce SBS [Kovalev]. Another method of higher mode suppression is to use a chiral gain fiber where the undesired modes are coupled out of the main gain fiber by secondary optical pathways.

The output of the amplifier may then enter a delivery fiber that routes the first pulse compression stage in order to physically separate the optical amplifier from pulse compression and nonlinear conversion stages. If a delivery fiber is used, a passive fiber (i.e., no dopants) is employed that is generally polarization-maintaining LMA fiber with a short length. The short length is selected to minimize its significant contribution to the overall effective length of the fiber used in the power amplifier. A reduced delivery fiber length and the use of large mode area fiber decreases nonlinear impairments that limit output peak optical power. Alternatively, polarization-maintaining hollow core fiber (also known as photonic crystal fiber) may be used.

The invention herein has the capability to increase average output power without increasing nonlinear fiber impairments caused by higher peak power. The average output power may be increased by increasing the pulse repetition rate of the master oscillator by means such as splitting and recombining with delay and by coupling more diode pump laser power to the power amplifier stage of the fiber amplifier. When the amount of pump power in the power amplifier stage is doubled and the master oscillator repetition rate is doubled, then the average output power is doubled while the peak power remains approximately the same. With this method, average powers in excess of 1 kW may be obtained (set by the optical damage of components and fiber) without the peak power of the fiber laser increasing to a point that fiber nonlinearities derate the desired emission characteristics. The agile nature of the fiber laser emission operational parameters as described by the invention herein is unique among high power laser systems.

The emission from the fiber amplifier stage then enters a pulse compression stage. The pulse compression stage utilizes one or more VPH gratings as the dispersive elements. Any means known in the art of pulse compression using gratings may be used. These means include a four grating compressor, a two grating double pass compressor, a four pass single grating compressor, and compressors that make use of lenses. The pulse compression stage does not need to compress the pulse to its minimum temporal duration. It is desirable to compress the output of the fiber amplifier until the peak power is increased only enough to obtain a sufficiently high conversion efficiency (>50% typically) in the nonlinear frequency conversion stage. Depending on the nonlinear optical material used and the geometry, this peak power is usually in the range of 10-20 kW. More peak power than this may not necessarily increase the conversion efficiency in the nonlinear conversion stage and is, thus, a detriment due to temporal walk-off of the fundamental and harmonic pulses, optical damage, and nonlinear impairments. While using a larger spot size will decrease the peak intensity and ameliorate damage and nonlinear concerns, temporal walk-off can only be reduced by using a shorter nonlinear crystal or a longer pulse.

The emission from the first compression stage then enters a nonlinear frequency conversion stage. This stage doubles the frequency of the light and will have a nominal power conversion efficiency of ~50%. The stage utilizes a nonlinear frequency conversion crystal such as lithium triborate (LBO), but other satisfactory crystals known in the art may be used.

The emission from the nonlinear conversion stage then may enter a second pulse compression stage designed to compress pulses at the wavelength of the frequency converted light. Any means known in the art of pulse compression using gratings may be used. These means include a four grating compressor, a two grating double pass compressor, a four pass single grating compressor, and compressors that make use of lenses. The second pulse compressor shortens the temporal duration of the pulse to approximately its minimum thereby maximizing its peak power. The output of the second pulse compressor is then delivered to its application. The application may be continued frequency conversion to lower visible or UV wavelengths. In the case that the peak power of the emission from the nonlinear conversion stage is sufficiently high for the application, the second pulse compression stage may not be used.

The apparatus may also contain two FC stages to convert a portion of the light from the fiber laser into output light at UV wavelengths. The conversion process involves an intermediate light frequency and FC stage to produce visible light. By way of example, the first NLO stage to convert the fundamental frequency to its second harmonic may be lithium triborate (LBO), and the second FC stage to convert the visible light into the DUV may be (β-barium borate (BBO) or UV-grade huntite.

The first embodiment described below has the following emission output parameters.

TABLE 1

Fiber laser output parameters of a first embodiment.

| | |
|---|---|
| Wavelength | 532 nm |
| Bandwidth | 100 pm |
| Pulse Duration | 5 ps |
| Average Power | 15 W |
| Peak Power | 31 kW |
| Pulse Energy | 150 nJ |
| Output Beam Spatial Profile | Predominately single mode, $M^2 < 1.3$ |
| Polarization | Linear, 20:1 |
| Repetition Rate | 100 MHz |

Figure 2:
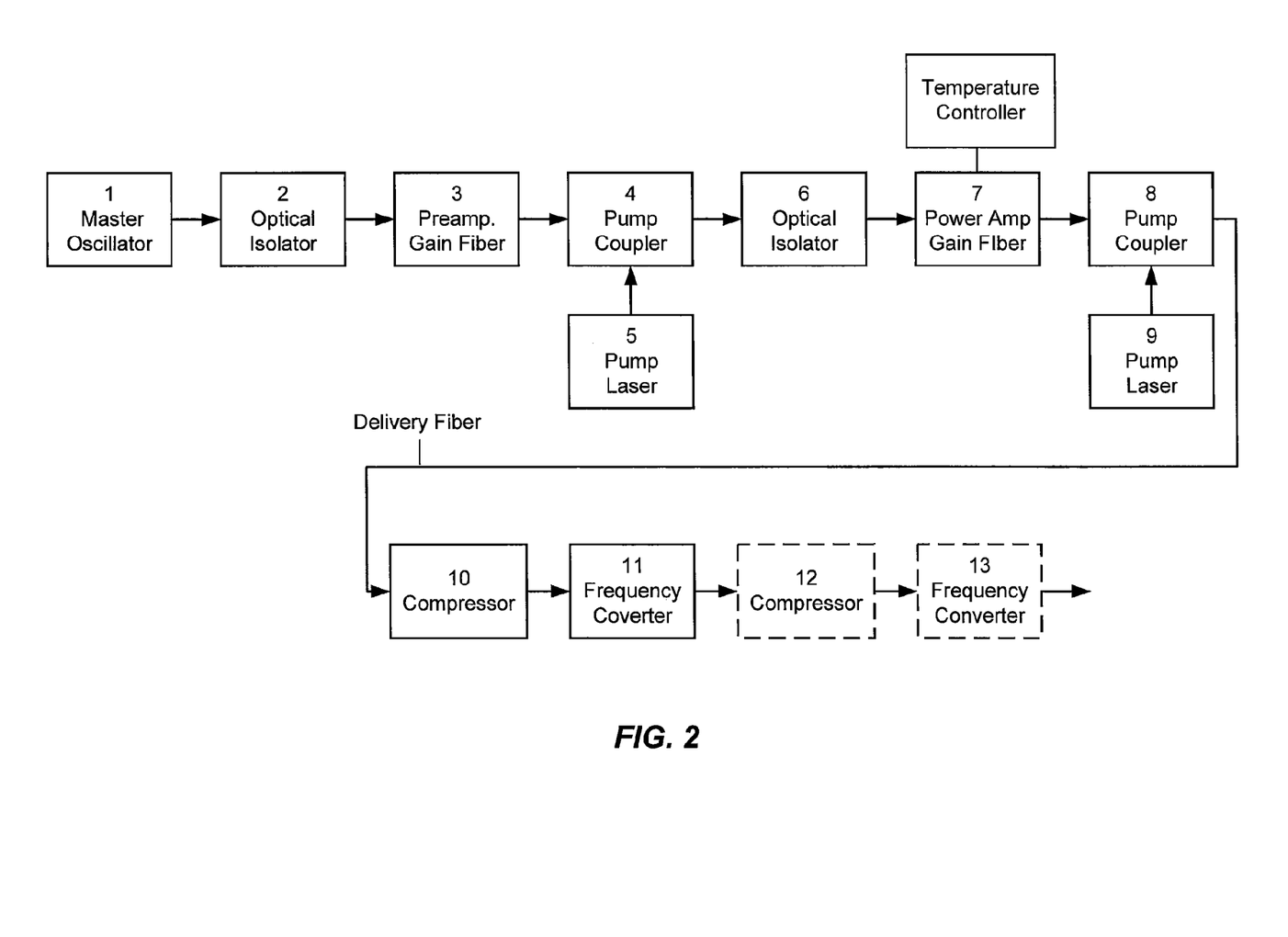
FIG. 2 is a schematic diagram of a fiber laser according to an embodiment of the present invention.

A schematic of the first embodiment is shown in FIG. 2. The fiber laser has a MOFA architecture with a preamplifier and power amplifier comprising the fiber laser system.

The Master Oscillator 1 is comprised of a diode laser that is frequency locked by a fiber Bragg grating in order to ensure the optical bandwidth is less than 300 pm in pulsed operation and passively mode locked using a semiconductor saturable absorber mirror (SESAM) in order to produce pulses of width 5 ps. The cavity length of the semiconductor/fiber cavity results in a pulse repetition rate of 50 MHz. The diode laser is pumped by a constant current source that provides gain to the mode-locked pulses. The pulsed output is then input into a chirped fiber Bragg grating that outputs pulsed light with a temporal duration of 150 ps that is linearly chirped with a positive chirp (higher wavelength is before lower wavelength) back into the signal fiber through an optical circulator or isolator. The 50 MHz pulse train is then input into a repetition rate doubler that increases the repetition rate of the pulse train to 100 MHz. The repetition rate doubler is an all fiber device consisting of a {1×2} fiber optic splitter and a {2×1} fiber optic combiner with one leg of the splitter/combiner pair having an optical path length difference of 10 ns from the other leg. The output of the Master Oscillator is fiber coupled into a single spatial mode, 6 μm core, polarization-maintaining fiber and has the following emission characteristics:

TABLE 2

Emission characteristics of master oscillator.

| | |
|---|---|
| Wavelength | 1064 nm |
| Bandwidth | 300 pm |
| Pulse Duration | 150 ps |
| Average Power | 50 mW |
| Peak Power | 3.3 W |
| Pulse Energy | 0.5 nJ |
| Output Beam Spatial Profile | Single Mode, $M^2 < 1.1$ |
| Repetition Rate | 100 MHz |
| Polarization | Linear, 40:1 |

The emission from the Master Oscillator propagates through a fiber-coupled optical isolator 2 that has an optical isolation of greater than 25 dB. The emission then propagates via fiber to the first stage of the fiber amplifier. The first stage of the fiber amplifier is comprised of a gain fiber 3, a pump coupler 4, and a diode laser pump 5. The gain fiber is an Yb-doped, 6 μm core, polarization-maintaining fiber of length 3 m. The gain fiber is pumped by a 1 W average power, continuous wave 976 nm wavelength diode laser through the pump coupler 4. The 976 nm pump laser is wavelength controlled, either by temperature or wavelength locking device, to an accuracy of ±1 nm. The pump coupler is a wavelength division multiplexing (WDM) device that couples the 976 nm pump light into the core of the gain fiber 3. The first amplifier stage has an unsaturated gain of 28 dB and amplifies the signal to an average output power of 0.5 W.

The output of the first gain stage then passes through a fiber-coupled isolator 6 with isolation greater than 25 dB. The input fiber to the isolator is 6 μm core, single mode, polarization-maintaining fiber. The output of the isolator is a 25 μm core diameter, few spatial mode, polarization-maintaining fiber. Other means known in the art including but not limited to tapered splices or mode field adapting optics may be used after the isolator in order to adapt between the differing fiber core diameters.

The emission from the optical isolator 6 propagates via fiber to the second stage of the fiber amplifier. The second stage of the fiber amplifier is comprised of a gain fiber 7, a pump coupler 8, and diode laser pumps 9. The gain fiber is an Yb-doped, double-clad, polarization-maintaining fiber of length 3 m. The gain fiber has a core diameter of 25 μm, a first cladding diameter of 250 μm, and a second cladding diameter of 400 μm. The gain fiber is wrapped around an 8 cm diameter temperature controlled spool. The gain fiber is pumped by a total of 36 W average optical power sourced from 6 continuous wave 976 nm wavelength diode lasers through the pump coupler. The 976 nm pump lasers are wavelength controlled, either by temperature or passive wavelength locking device, to an accuracy of ±1 nm and emit 6 W of continuous output power each. The pump coupler combines the light from six 976 nm pump lasers into the cladding of the gain fiber 3. The pump coupler 8 used in this embodiment is a {6×1×1} star coupler that couples the light from six multimode 200 μm core diameter fibers into the cladding of the gain fiber. The pump coupler 8 is similar in design to that described in U.S. Pat. No. 6,434,302. Other of the various means known in the art to couple multiple pumps into a double clad gain fiber may be used. The second amplifier stage has an unsaturated gain of 20 dB and amplifies the signal to an average output power of 40 W. The peak power of the 150 ps pulses at the output of the fiber amplifier is 3.3 kW.

Note that the spectral bandwidth of the output emission (300 pm) is equal to the spectral bandwidth of the master oscillator emission. This is due to the low peak power of the master oscillator emission and its pulse chirped nature. Negligible SPM-induced spectral broadening occurs.

The output of the amplifier then propagates through a 25 μm core passive (no dopants) delivery fiber of length 1 m and output into free space into the first compression stage 10.

The first compression stage 10 is made up of coupling optics that collimate the output beam of the delivery fiber, two 1800 grooves per mm volume phase holographic gratings, and two mirrors. Other methods known in the art of pulse compression using VPH gratings may be used. Since the input pulse has a positive chirp, the compressor needs to have negative group velocity dispersion, where the optical path length for the shorter wavelength is less than that for the longer wavelength. The method for pulse compression in this embodiment is a two grating, double pass pulse compressor without lenses that compresses the temporal duration of the pulse by a factor of ten, resulting in a pulse duration of 15 ps and a peak power of approximately 27 kW and average power of 32 W. The pulse compressor has a power efficiency of about 80%.

The 1064 nm wavelength output of the first compressor 10 enters into the nonlinear frequency conversion stage 11 where it is converted into light with a wavelength of 532 nm at a conversion efficiency of 60%. The nonlinear conversion stage is made up of a focusing assembly that focuses the output of the first compressor to a beam with 60 μm $1/e^2$ waist inside of a 20 mm long LBO crystal. The LBO crystal is cut for non-critical phase-matched conversion of 1064 nm to 532 nm wavelength light and is temperature controlled. After passing through the LBO crystal, the 1064 nm emission is separated from the converted 532 nm light. The 532 light is then collimated resulting and passes onto the second compression stage 12. The resulting 532 nm pulse train has an average power of 19.2 W, temporal pulse width of 12 ps, 100 pm bandwidth, and 16 kW peak power.

The second compression stage 12 is made up of coupling optics that collimate the output beam of the delivery fiber, two 1800 grooves per mm VPH gratings, and two mirrors. Since the input pulse is has a positive chirp, the compressor needs to have negative group velocity dispersion, where the optical path length for the shorter wavelength is less than that for the longer wavelength. The method for pulse compression in this embodiment is a two grating, double pass pulse compressor without lenses that compresses the temporal duration of the pulse by a factor of a 2.4, resulting in a pulse duration of 5 ps, a peak power of approximately 31 kW and average power of 15 W. The pulse compressor has a power efficiency of about 80%.

The output of the second pulse compressor then exits the system to the application.

Embodiments of the present invention can be utilized in a number of different applications and systems, including a light detection and ranging (LIDAR) system, a laser-based micromachining system, a laser-based defect inspection system, a laser-based treatment or analysis system for use with biological tissues or processes, in a laser-based remote sensing system, a laser-based communications system, or the like.

Figure 3:
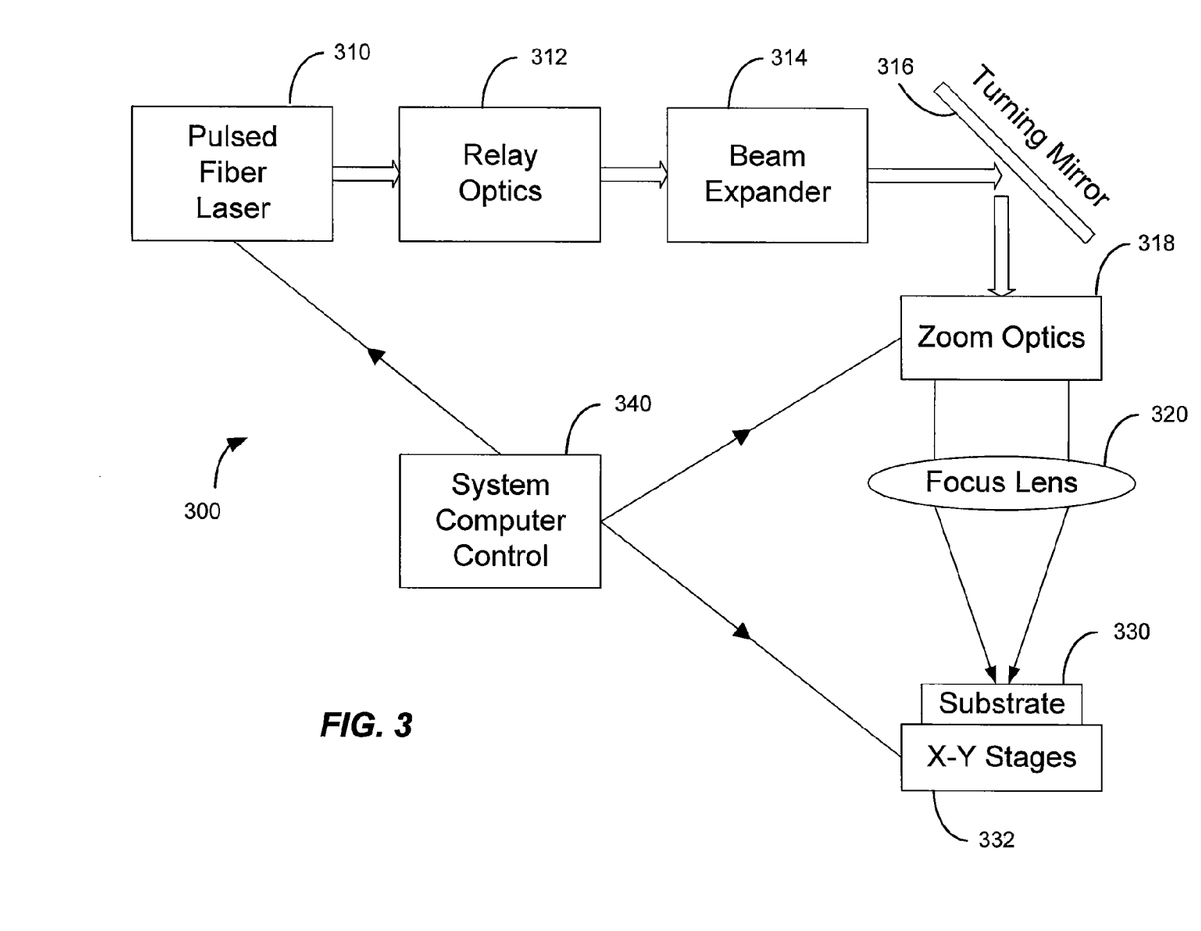
FIG. 3 is a simplified schematic diagram illustrating a micromachining system according to an embodiment of the present invention.

FIG. 3 is a simplified schematic diagram illustrating a micromachining system according to an embodiment of the present invention. As shown in FIG. 3, the micromachining system 300 includes a pulsed fiber laser 310. Pulsed fiber lasers as described throughout the present specification are suitable for use in the micromachining system. Relay optics 312 deliver the output of the pulsed fiber laser 310 to a beam expander 314, which expands the beam dimension as a function of propagation distance. The turning mirror 316 directs the optical beam toward zoom optics 318 and focus lens 320. Although only two optical elements are illustrated as the zoom optics and the focus lens, one of skill in the art will appreciate that additional optical elements may be utilized depending on the particular optical design. The laser light is focused onto a substrate 330 that is supported on X-Y stages 332. One or more elements of the micromachining system 300 are under control of system computer control 340, which communicates in a one way or two way manner with the various system components. Embodiments of the present invention include SHG, 4HG, or 8HG wavelengths for micromachining applications. The pulsed fiber laser systems 310 in these embodiments may include one or more nonlinear frequency conversion elements that provide an output at a predetermined wavelength (e.g., a frequency quadrupled wavelength of 266 nm) for these micromachining applications.

Figure 4:
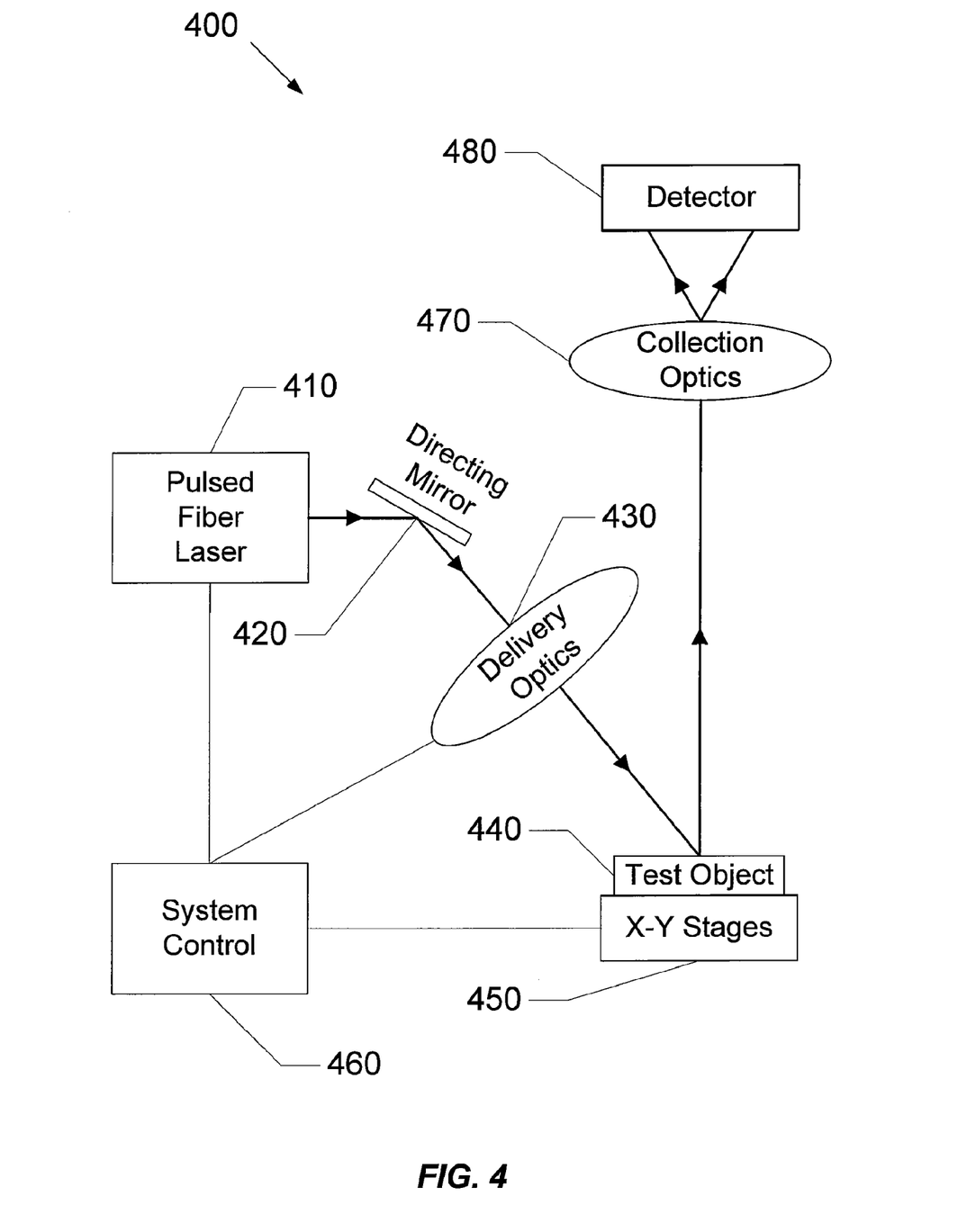
FIG. 4 is a simplified schematic diagram illustrating an inspection system according to an embodiment of the present invention.

FIG. 4 is a simplified schematic diagram illustrating an inspection system according to an embodiment of the present invention. As shown in FIG. 4, the inspection system 400 includes a pulsed fiber laser 410. Pulsed fiber lasers as described throughout the present specification are suitable for use in the inspection system. Directing mirror 420 deliver the output of the pulsed fiber laser 410 to the object to be inspected 440 via focusing, shaping, and zoom optics 430. The object 440 is translated on an x-y stage 450 that is controlled by computer 460 that also controls delivery optics 430 focus and operation of the pulsed fiber laser 410. The light is scattered and/or reflected from the object and collected by optics 470 and enters the detector 480, such as a CCD camera. Although only the basic optical elements are shown on this inspection system, one of skill in the art will appreciate that additional optical elements may be utilized depending on the particular optical design. Furthermore, a variety of motion control and adjustment may be used as known in the art. Embodiments of the present invention include SHG, 4HG, or 8HG wavelengths for inspection applications. The pulsed fiber laser systems 410 in these embodiments may include one or more nonlinear frequency conversion elements that provide an output at a predetermined wavelength (e.g., a frequency quadrupled wavelength of 266 nm) for these inspection applications.

In a second embodiment, the repetition rate of the pulsed master oscillator is decreased such that there is sufficient peak power out of the amplifier to enable efficient frequency conversion without the first stage of compression. Thus, only the second stage of compression is used on the 532 nm pulse train. In the case that a lower repetition rate is suitable for the application, the system described in the second embodiment produces very high peak power with the benefit of only one compression stage. The resulting emission from the laser described in this embodiment is described below:

TABLE 3

Fiber laser output parameters of a second embodiment.

| | |
|---|---|
| Wavelength | 532 nm |
| Bandwidth | 100 pm |
| Pulse Duration | 5 ps |
| Average Power | 20 W |
| Peak Power | 500 kW |
| Pulse Energy | 2 µJ |
| Output Beam Spatial Profile | Predominately single mode, $M^2 < 1.3$ |
| Polarization | Linear, 20:1 |
| Repetition Rate | 10 MHz |

The master oscillator has much the same output specifications as the master oscillator of the first embodiment except that the repetition rate is lower by a factor of 10 and the pulse energy/peak power is higher by a factor of 10 as listed below:

TABLE 4

Emission characteristics of master oscillator in a second embodiment.

| | |
|---|---|
| Wavelength | 1064 nm |
| Bandwidth | 300 pm |
| Pulse Duration | 150 ps |
| Average Power | 50 mW |
| Peak Power | 33 W |
| Pulse Energy | 5 nJ |
| Output Beam Spatial Profile | Single Mode, $M^2 < 1.1$ |
| Repetition Rate | 10 MHz |
| Polarization | Linear, 40:1 |

The optical isolator stage and fiber amplifier stages are the same in the second embodiment as the first embodiment. The resulting 1064 nm wavelength output has an average output power of 40 W, temporal pulse width of 150 ps pulses, and peak power of 33 kW.

The peak power of the amplified pulses is sufficiently high as to not require a compression stage (first compression stage in FIG. 2) to obtain high efficiency in frequency conversion.

The 1064 nm wavelength output of the fiber amplifier enters into the nonlinear frequency conversion stage where it is converted into light with a wavelength of 532 nm at a conversion efficiency of 62%. The nonlinear conversion stage is made up of a focusing assembly that focuses the output of the first compressor to a beam with 60 µm $1/e^2$ waist inside of a 20 mm long LBO crystal. The LBO crystal is cut for non-critical phase-matched conversion of 1064 nm to 532 nm and is temperature controlled. After passing through the LBO crystal, the 1064 nm emission is separated from the converted 532 nm light. The 532 light is then collimated resulting and passes onto the compression stage. The resulting 532 nm pulse train has an average power of 25 W, temporal pulse width of 120 ps, 100 pm bandwidth, and 21 kW peak power.

The following compression stage is made up of coupling optics that collimate the output beam of the delivery fiber, two 1800 grooves per mm VPH gratings, and two mirrors. This compression stage is identical to the second compression stage in the first embodiment but with the distances between the gratings increased to provide more temporal compression. The pulse compressor compresses the temporal duration of the pulse by a factor of a 24, resulting in a pulse duration of 5 ps, a peak power of approximately 500 kW and average power of 20 W. The pulse compressor has a power efficiency of about 80%. The output of the pulse compressor then exits the system to the application.

In a third embodiment, the repetition rate of the pulsed master oscillator is increased in order to fulfill an application that requires a 250 MHz pulse train. If the fiber amplifier and nonlinear conversion stages described in the proceeding embodiments is used the output pulses of the master oscillator need to be compressed down to 5 ps in order to obtain sufficient frequency conversion efficiency. Thus, the second pulse compression stage has no benefit since the 532 nm wavelength pulse coming exiting the nonlinear conversion stage can not be significantly compressed. The third embodiment does not contain a second pulse compression stage following the nonlinear conversion stage for this reason. The resulting emission from the laser described in this embodiment is described below:

TABLE 5

Fiber laser output parameters of a third embodiment.

| | |
|---|---|
| Wavelength | 532 nm |
| Bandwidth | 100 pm |
| Pulse Duration | 5 ps |
| Average Power | 19 W |
| Peak Power | 15 kW |
| Pulse Energy | 76 nJ |
| Output Beam Spatial Profile | Predominately single mode, $M^2 < 1.3$ |
| Polarization | Linear, 20:1 |
| Repetition Rate | 250 MHz |

The master oscillator has much the same output specifications as the master oscillator of the first embodiment except that the repetition rate is increased by a factor of 2.5 and the pulse energy/peak power is higher by a factor of 2.5 as listed below:

TABLE 6

Emission characteristics of master oscillator in the third embodiment.

| | |
|---|---|
| Wavelength | 1064 nm |
| Bandwidth | 300 pm |
| Pulse Duration | 150 ps |
| Average Power | 50 mW |
| Peak Power | 1.3 W |
| Pulse Energy | 0.2 nJ |
| Output Beam Spatial Profile | Single Mode, $M^2 < 1.1$ |
| Repetition Rate | 250 MHz |
| Polarization | Linear, 40:1 |

The optical isolator stage and fiber amplifier stages are the same in the third embodiment as the first embodiment. The resulting 1064 nm wavelength output has an average output power of 40 W, temporal pulse width of 150 ps pulses, and peak power of 1.1 kW.

The following compression stage is made up of coupling optics that collimate the output beam of the delivery fiber, two 1800 grooves per mm VPH gratings, and two mirrors. This compression stage is identical to the first compression stage in the first embodiment but with the distances between the gratings increased to provide the maximal temporal compression. The pulse compressor compresses the temporal duration of the pulse by a factor of a 30, resulting in a pulse duration of 5 ps, a peak power of approximately 26 kW and average power of 32 W. The pulse compressor has a power efficiency of about 80%.

The 1064 nm wavelength output of the pulse compressor enters into the nonlinear frequency conversion stage where it is converted into light with a wavelength of 532 nm at a conversion efficiency of 59%. The nonlinear conversion stage is made up of a focusing assembly that focuses the output of the first compressor to a beam with 60 μm $1/e^2$ waist inside of a 20 mm long LBO crystal. The LBO crystal is cut for non-critical phase matched conversion of 1064 nm to 532 nm and is temperature controlled. After passing through the LBO crystal, the 1064 nm emission is separated from the converted 532 nm light. The 532 light is then collimated resulting and passes onto the compression stage. The resulting 532 nm pulse train has an average power of 19 W, temporal pulse width of 5 ps, 100 pm bandwidth, and 15.2 kW peak power. The output of the nonlinear conversion stage then exits the system to the application.

The three embodiments described above provide a novel laser system that is very agile in its repetition rate and output peak power. This laser may be tailored to many different applications by making small changes in the emission characteristics of the master oscillator and the pulse compression stages.

The foregoing description of the various embodiments of the invention has been presented for purposes of illustration and description. Similar can be obtained at other wavelengths such as 1550 nm for an Er-doped fiber system or an Er/Yb-codoped fiber system. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as a suited to the particular use contemplated.

Thus, while only certain embodiments of the invention have been specifically described herein, it will be apparent that numerous modifications may be made thereto without departing from the spirit and scope of the invention. Further, any acronyms are used merely to enhance the readability of the specification and claims. It should be noted that these acronyms are not intended to lessen the generality of the terms used and they should not be construed to restrict the scope of the claims to the embodiments described therein.

What is claimed is:

1. An apparatus for producing coherent pulsed light from a fiber-based master oscillator/fiber amplifier architecture, the apparatus comprising:
    a predominately single spatial mode, linearly polarized master oscillator providing a set of optical pulses;
    a polarization-maintaining optical isolator optically coupled to the master oscillator;
    a fiber amplifier optically coupled to the optical isolator and including a power amplifier comprising a double clad gain fiber, one or more pump lasers, and a pump coupler;
    a pulse compression stage optically coupled to the fiber amplifier, wherein the pulse compression stage comprises a volume holographic phase grating; and
    a nonlinear frequency conversion stage optically coupled to the pulse compression stage.

2. The apparatus of claim 1 wherein the volume holographic phase transmission grating comprises more than 1750 lines per mm.

3. The apparatus of claim 2 wherein each of the set of optical pulses are characterized by a pulse width and an output of the pulse compression stage includes a second set of optical pulses, each of the second set of optical pulses being characterized by a second pulse width less than one fifth of the pulse width.

4. The apparatus of claim 1 wherein the nonlinear frequency conversion stage comprises at least one frequency converter of BBO, LBO, or UV-grade huntite.

5. The apparatus of claim 1 further comprising a second pulse compression stage optically coupled to the nonlinear frequency conversion stage.

6. The apparatus of claim 5 wherein the second pulse compression stage comprises a volume holographic phase transmission grating.

7. The apparatus of claim 1 wherein the double clad gain fiber comprises a polarization-maintaining, large-mode-area, Yb-doped fiber having an inner cladding and an outer cladding.

8. The apparatus of claim 7 wherein the one or more pump lasers provides pump radiation having a wavelength ranging from 970 to 982 nm.

9. The apparatus of claim 1 wherein an output of the apparatus is characterized by a peak power from 1 kW to 1 MW and an average power of 5-200 W.

10. The apparatus of claim 1 wherein an output of the apparatus is optically coupled from the power amplifier to the pulse compression stage via a large mode area polarization-maintaining delivery fiber of length less than 5 m.

11. The apparatus of claim 1 wherein an output of the apparatus is characterized by pulses of durations of 10 ps to 1 ns and pulse repetition rates of 10 MHz to 1 GHz with a spectral bandwidth of less than 0.5 nm.

12. The apparatus of claim 1 wherein an output of the apparatus is characterized by a predominately single spatial mode at wavelength between 508 and 542 nm.

13. The apparatus of claim 1 wherein the fiber amplifier further comprises one or more preamplifier stages preceding the power amplifier, wherein each of the one or more preamplifier stages comprises a polarization-maintaining doped gain fiber having a core and a cladding, one or more pumps energizing the gain fiber, and an optical coupler to couple the pump power into the cladding or core of the gain fiber.

14. The apparatus of claim 13 further comprising an optical isolator between the one or more preamplifier stages and the power amplifier.

15. The apparatus of claim 1 wherein the master oscillator comprise a frequency-controlled, passively mode-locked diode laser pumped by an electric current.

16. The apparatus of claim 1 wherein the master oscillator comprises a frequency controlled CW diode laser coupled to an external electro-optic modulator.

17. The apparatus of claim 1 wherein the master oscillator comprises a diode-pumped solid-state laser.

18. The apparatus of claim 1 wherein the master oscillator comprises a frequency controlled, passively mode-locked fiber laser.

19. The apparatus of claim 1 wherein one of the one or more pulse compression stages provides an input to the nonlinear frequency conversion stage.

20. The apparatus of claim 1 wherein another of the one or more pulse compression stages receives an output of the nonlinear frequency conversion stage.

21. The apparatus of claim 1 wherein the pump coupler comprises an $\{n \times 1 \times 1\}$ fused star coupler, wherein n is an integer greater than or equal to one.

22. The apparatus of claim 1 wherein an output of the nonlinear frequency conversion stage comprises ultraviolet light of a wavelength less than or equal to 400 nm.

* * * * *

UNITED STATES PATENT AND TRADEMARK OFFICE
CERTIFICATE OF CORRECTION

| | | |
|---|---|---|
| PATENT NO. | : 7,733,922 B1 | Page 1 of 1 |
| APPLICATION NO. | : 12/239676 | |
| DATED | : June 8, 2010 | |
| INVENTOR(S) | : Michael J. Munroe et al. | |

It is certified that error appears in the above-identified patent and that said Letters Patent is hereby corrected as shown below:

Column 16, line 25, delete the word "transmission".

Signed and Sealed this
Fourth Day of January, 2011

David J. Kappos
*Director of the United States Patent and Trademark Office*